(12) United States Patent
Guan et al.

(10) Patent No.: US 12,009,184 B2
(45) Date of Patent: Jun. 11, 2024

(54) LIFT PIN ASSEMBLY FOR A PLASMA PROCESSING APPARATUS

(71) Applicants: Beijing E-Town Semiconductor Technology Co., Ltd., Beijing (CN); Mattson Technology, Inc., Fremont, CA (US)

(72) Inventors: Changle Guan, Beijing (CN); Maolin Long, Santa Clara, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 178 days.

(21) Appl. No.: 17/411,493

(22) Filed: Aug. 25, 2021

(65) Prior Publication Data
US 2023/0010075 A1 Jan. 12, 2023

(30) Foreign Application Priority Data

Jul. 6, 2021 (CN) .......................... 202110760298.6

(51) Int. Cl.
*H01J 37/32* (2006.01)
*H01L 21/683* (2006.01)

(52) U.S. Cl.
CPC .... *H01J 37/32715* (2013.01); *H01L 21/6833* (2013.01)

(58) Field of Classification Search
CPC ...................... H01L 21/68742; H01L 21/6833
See application file for complete search history.

(56) References Cited

U.S. PATENT DOCUMENTS

| 7,204,888 | B2 | 4/2007 | Tran et al. |
| 7,292,427 | B1 | 11/2007 | Murdoch et al. |
| 8,363,378 | B2 | 1/2013 | Bluck et al. |
| 10,784,142 | B2 | 9/2020 | Marcelynas et al. |
| 2003/0205329 | A1* | 11/2003 | Gujer ................. C23C 16/4586 118/728 |
| 2017/0133260 | A1* | 5/2017 | Pohl ................. H01L 21/68742 |

(Continued)

FOREIGN PATENT DOCUMENTS

| CN | 101276777 B | 8/2010 |
| CN | 108257901 A | 7/2018 |

(Continued)

*Primary Examiner* — Kaitlin S Joerger
(74) *Attorney, Agent, or Firm* — Dority & Manning, P.A.

(57) ABSTRACT

A lift pin assembly for a lift pin of a plasma processing apparatus is provided. The lift pin assembly includes a pin housing defining an opening into which a lift pin extends. The pin housing is positioned such that the opening is aligned with an opening defined by an electrostatic chuck. The assembly includes a pin height adjustment member partially positioned within the opening defined by the pin housing. The pin height adjustment member is movable along an axis in a first direction and a second direction to move the lift pin into and out of the opening defined by the electrostatic chuck. The assembly includes a pin holder assembly at least partially positioned within an opening defined by the pin height adjustment member. The pin holder assembly is configured to hold the lift pin such that the lift pin is aligned with the opening defined by the electrostatic chuck.

19 Claims, 12 Drawing Sheets

(56) References Cited

U.S. PATENT DOCUMENTS

| | | | |
|---|---|---|---|
| 2019/0027394 A1* | 1/2019 | Sarode Vishwanath | H01L 21/68757 |
| 2019/0067076 A1* | 2/2019 | Zvokelj | F16K 51/02 |
| 2019/0080955 A1* | 3/2019 | Lee | G03F 7/70691 |
| 2019/0131165 A1* | 5/2019 | Nguyen | B23Q 7/005 |
| 2021/0066115 A1* | 3/2021 | Dür | H01L 21/68742 |
| 2021/0134651 A1* | 5/2021 | Dünser | H01L 21/68785 |
| 2022/0020629 A1* | 1/2022 | Eschenmoser | G01K 13/00 |
| 2022/0044957 A1* | 2/2022 | Dür | H01L 21/68742 |
| 2022/0076987 A1* | 3/2022 | Eschenmoser | G01P 15/02 |
| 2022/0091519 A1* | 3/2022 | Do | G03F 7/70808 |
| 2022/0293451 A1* | 9/2022 | Sulyman | H01L 21/68742 |
| 2022/0293452 A1* | 9/2022 | Sulyman | H01L 21/68742 |
| 2022/0399217 A1* | 12/2022 | Marzinotto | H01L 21/67259 |
| 2022/0415702 A1* | 12/2022 | Drewery | H01J 37/32623 |
| 2023/0075313 A1* | 3/2023 | Jiang | H01L 21/67184 |

FOREIGN PATENT DOCUMENTS

| | | |
|---|---|---|
| CN | 109300836 A | 2/2019 |
| CN | 109390199 A | 2/2019 |
| CN | 109844176 A | 6/2019 |
| CN | 110299306 A | 10/2019 |

* cited by examiner

LIFT PIN ASSEMBLY FOR A PLASMA PROCESSING APPARATUS

PRIORITY CLAIM

The present application claims the benefit of priority of Chinese Patent Application No. 202110760298.6, titled "Lift Pin Assembly for a Plasma Processing Apparatus," having a filing date of Jul. 6, 2021, which is incorporated by reference herein.

FIELD

The present disclosure relates generally to plasma processing apparatuses and more, specifically, a lift pin assembly for plasma processing apparatuses.

BACKGROUND

Plasma processing tools can be used in the manufacture of devices such as integrated circuits, micromechanical devices, flat panel displays, and other devices. Plasma processing tools used in modern plasma etch applications can be required to provide a high plasma uniformity and a plurality of plasma controls, including independent plasma profile, plasma density, and ion energy controls. Plasma processing tools can, in some cases, be required to sustain a stable plasma in a variety of process gases and under a variety of different conditions (e.g. gas flow, gas pressure, etc.).

Pedestal assemblies can be used to support a workpiece (e.g., semiconductor wafer) in a plasma processing apparatus and other processing tools (e.g., thermal processing tools). For instance, pedestal assemblies can include an electrostatic chuck that supports the workpiece. Furthermore, pedestal assemblies can include a plurality of lift pins that are movable in a first direction to lift the workpiece off of the electrostatic chuck and a second direction to lower the workpiece onto the electrostatic chuck. Each of the lift pins can move within a corresponding opening of a plurality of openings defined by the electrostatic chuck.

SUMMARY

Aspects and advantages of the disclosure will be set forth in part in the following description, or may be obvious from the description, or may be learned through practice of the embodiments.

In one aspect, a lift pin assembly for a lift pin of a plasma processing apparatus is provided. The lift pin assembly includes a pin housing defining an opening into which the lift pin extends. The pin housing is positioned such that the opening is aligned with an opening defined by an electrostatic chuck of the plasma processing apparatus. The lift pin assembly includes a pin height adjustment member partially positioned within the opening defined by the pin housing. The pin height adjustment member is movable along an axis in a first direction and a second direction. The pin height adjustment member is movable in the first direction to move the lift pin into the opening defined by the electrostatic chuck. The pin height adjustment member is movable in the second direction to move the lift pin out of the opening defined by the electrostatic chuck. The lift pin assembly includes a pin holder assembly at least partially positioned within an opening defined by the pin height adjustment member. The pin holder assembly is configured to hold the lift pin such that the lift pin is aligned with the opening defined by the electrostatic chuck.

In another aspect, a plasma processing apparatus is provided. The plasma processing apparatus includes a processing chamber and an electrostatic chuck. The electrostatic chuck is positioned within the processing chamber. The electrostatic chuck is configured to support a workpiece. The plasma processing apparatus includes a lift pin assembly. The lift pin assembly includes a pin housing defining an opening into which the lift pin extends. The pin housing is positioned such that the opening is aligned with an opening defined by an electrostatic chuck of the plasma processing apparatus. The lift pin assembly includes a pin height adjustment member partially positioned within the opening defined by the pin housing. The pin height adjustment member is movable along an axis in a first direction and a second direction. The pin height adjustment member is movable in the first direction to move the lift pin into the opening defined by the electrostatic chuck. The pin height adjustment member is movable in the second direction to move the lift pin out of the opening defined by the electrostatic chuck. The lift pin assembly includes a pin holder assembly at least partially positioned within an opening defined by the pin height adjustment member. The pin holder assembly is configured to hold the lift pin such that the lift pin is aligned with the opening defined by the electrostatic chuck.

These and other features, aspects and advantages of the present disclosure will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure to one of ordinary skill in the art is set forth more particularly in the remainder of the specification, including reference to the accompanying figures, in which.

DETAILED DESCRIPTION

Figure 1:
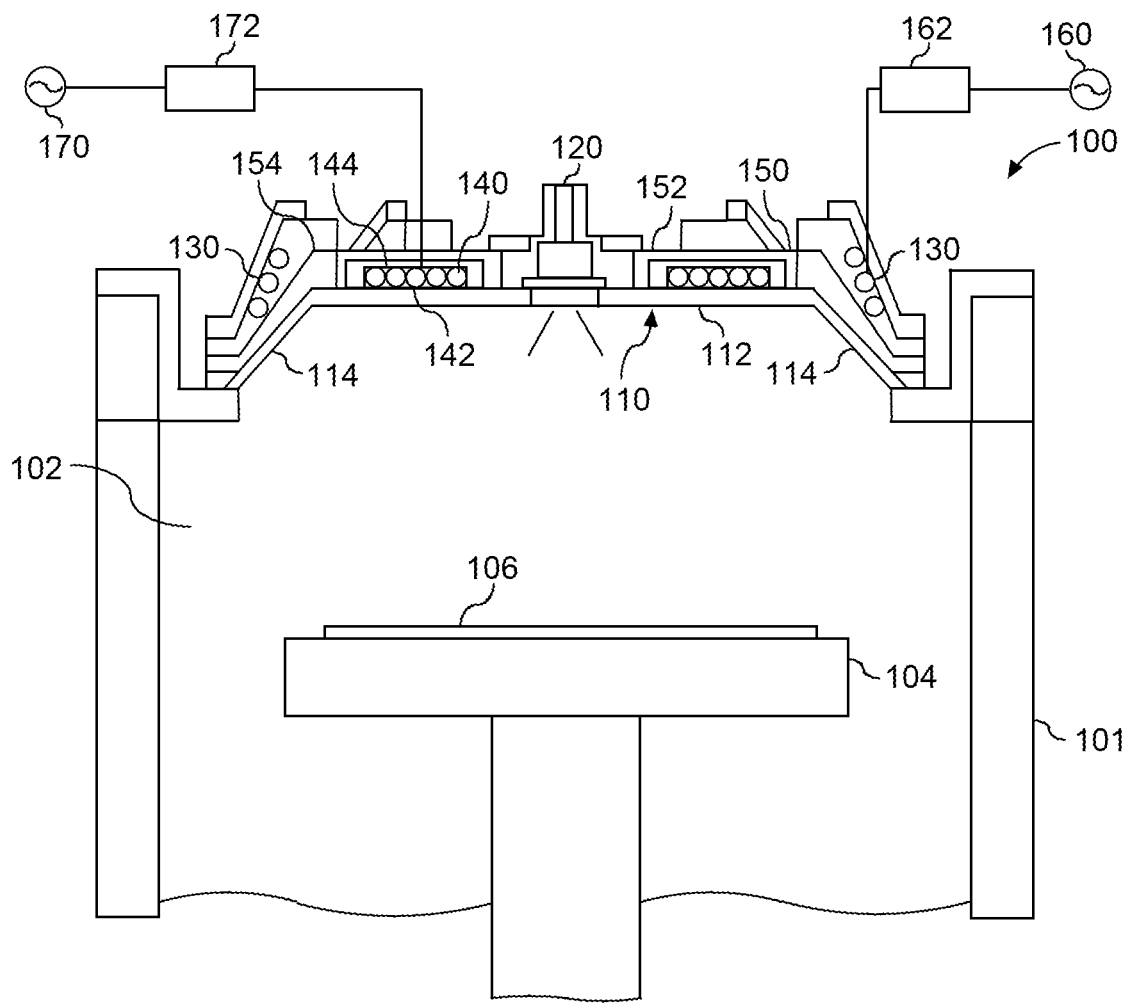
FIG. 1 depicts an example plasma processing apparatus according to an example embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to plasma processing apparatuses. Plasma processing apparatuses can include a processing chamber. Plasma processing apparatuses can further include pedestal assemblies to support a workpiece (e.g., semiconductor wafer) positioned within the processing chamber. Pedestal assemblies can include an electrostatic chuck configured to support the workpiece. Pedestal assemblies can further include a plurality of lift pins. Each of the plurality of lift pins can be movable in a first direction to lift the workpiece off of the electrostatic chuck. Furthermore, each of the plurality of lift pins can be movable in a second direction that is opposite the first direction to lower the workpiece onto the electrostatic chuck.

Each of the lift pins extends through a corresponding opening defined by the electrostatic chuck. However, over several cycles, one or more of the lift pins can become misaligned (e.g., not parallel) with the corresponding opening in the electrostatic chuck. This misalignment can cause the one or more lift pins to contact (e.g., rub) the electrostatic chuck. Furthermore, friction due to one or more lift pins contacting the electrostatic chuck can cause the one or more lift pins to shear. Alternatively, or additionally, particles that are generated due to the friction can accumulate on the one or more lift pins. Furthermore, in some instances, the friction can be so great that the lift pin breaks.

Example aspects of the present disclosure are directed a lift pin assembly for a lift pin of a plasma processing apparatuses. The lift pin assembly can include a pin housing. The pin housing can define an opening into which the lift pin extends. The lift pin assembly can further include a pin height adjustment member. The pin height adjustment member can move along an axis to adjust an amount of the lift pin that is positioned within the corresponding opening defined by the electrostatic chuck. For instance, the pin height adjustment member can move along the axis in the first direction to move the lift pin into the corresponding opening defined by the electrostatic chuck to lift the workpiece off of the electrostatic chuck. Conversely, the pin height adjustment member can move along the axis in the second direction to pull the lift pin out of the corresponding opening defined by the electrostatic chuck to lower the workpiece onto the electrostatic chuck.

The pin height adjustment member can be partially positioned within the opening defined by the pin housing. For instance, the pin height adjustment member can include a first portion positioned within the opening defined by the pin housing and a second portion positioned outside of the opening defined by the pin housing. In some implementations, the first portion of the pin height adjustment member can have a first shape, whereas the second portion of the pin height adjustment member can have a second shape that is different than the first shape.

The lift pin assembly can include a pin holder assembly at least partially positioned within an opening defined by the pin height adjustment member. The pin holder assembly can be configured to hold the lift pin such that the lift pin is aligned (e.g., parallel) with the corresponding opening defined by the electrostatic chuck. In this manner, the lift pin assembly can prevent contact between the lift pin and the electrostatic chuck due, at least in part, to the lift pin being misaligned (e.g., not parallel) with the opening defined by the electrostatic chuck.

In some implementations, the lift pin assembly can include a fastener configured to lockout the pin height adjustment member once the lift pin is at a desired height. For instance, the desired height can correspond to a first height needed to lift the workpiece off of the electrostatic chuck. Alternatively, the desired height can correspond to a second height that is different than the first height and needed to set the workpiece on the electrostatic chuck. In this manner, the pin height adjustment member can be locked out via the fastener to hold the lift pin at the desired height.

Pedestal assemblies according to example aspects of the present disclosure can have a number of technical effects and benefits. For instance, the pin holder assembly can hold the lift pin such that the lift pin remains aligned (e.g., parallel) with the corresponding opening in the electrostatic chuck. In this manner, contact between the lift pin and the electrostatic chuck due to the lift pin being misaligned with the corresponding opening in the electrostatic chuck can be avoided. Furthermore, the fastener can lockout the pin height adjustment member once the lift pin reaches a desired height.

Aspects of the present disclosure are discussed with reference to a "substrate" or "wafer" for purposes of illustration and discussion. Those of ordinary skill in the art, using the disclosures provided herein, will understand that the example aspects of the present disclosure can be used in association with any semiconductor substrate or other suitable substrate or workpiece.

Referring now to the FIGS., FIG. 1 depicts a plasma processing apparatus 100 according to example embodiments of the present disclosure. The present disclosure is discussed with reference to the plasma processing apparatus 100 depicted in FIG. 1 for purposes of illustration and discussion. Those of ordinary skill in the art, using the disclosures provided herein, will understand that example aspects of the present disclosure can be used with other processing tools and/or apparatus without deviating from the scope of the present disclosure, such as plasma strip tools, thermal processing tools, etc.

The plasma processing apparatus 100 includes a processing chamber 101 defining an interior space 102. A pedestal assembly 104 is used to support a workpiece 106, such as a semiconductor wafer, within the interior space 102. A dielectric window 110 is located above the pedestal assembly 104 and acts as a ceiling of the interior space 102. The dielectric window 110 includes a relatively flat central portion 112 and an angled peripheral portion 114. The dielectric window 110 includes a space in the flat central portion 112 for a showerhead 120 to feed process gas into the interior space 102.

The plasma processing apparatus 100 further includes a plurality of inductive elements, such as primary inductive element 130 and secondary inductive element 140, for generating an inductive plasma in the interior space 102. The inductive elements 130, 140 can include a coil or antenna element that when supplied with RF power, induces a plasma in the process gas in the interior space 102 of plasma processing apparatus 100. For instance, a first RF generator 160 can be configured to provide electromagnetic energy through a matching network 162 to the primary inductive element 130. A second RF generator 170 can be configured to provide electromagnetic energy through a matching network 172 to the secondary inductive element 140.

While the present disclosure makes reference to a primary inductive element and a secondary inductive element, those of ordinary skill in the art, should appreciate that the terms primary and secondary are used for convenience purposes only. The secondary coil can be operated independently of the primary coil. The primary coil can be operated independently of the secondary coil. In addition, in some embodiments, the plasma processing apparatus may only have a single inductive coupling element.

According to aspects of the present disclosure, the plasma processing apparatus 100 can include a metal shield portion 152 disposed around the secondary inductive element 140. The metal shield portion 152 separates the primary inductive element 130 and the secondary inductive element 140 to reduce cross-talk between the inductive elements 130, 140. The plasma processing apparatus 100 can further include a first Faraday shield 154 disposed between the primary inductive element 130 and the dielectric window 110. The first Faraday shield 154 can be a slotted metal shield that reduces capacitive coupling between the primary inductive element 130 and the process chamber 101. As illustrated, the first Faraday shield 154 can fit over the angled portion of the dielectric window 110.

In some implementations, the metal shield portion 152 and the first Faraday shield 154 can form a unitary body metal shield/Faraday shield 150 for ease of manufacturing and other purposes. The multi-turn coil of the primary inductive element 130 can be located adjacent the Faraday shield 154 of the unitary body metal shield/Faraday shield 150. The secondary inductive element 140 can be located proximate the metal shield portion 152 of metal shield/Faraday shield unitary body 150, such as between the metal shield portion 152 and the dielectric window 110.

The arrangement of the primary inductive element 130 and the secondary inductive element 140 on opposite sides of the metal shield portion 152 allows the primary inductive element 130 and secondary inductive element 140 to have distinct structural configurations and to perform different functions. For instance, the primary inductive element 130 can include a multi-turn coil located adjacent a peripheral portion of the process chamber 101. The primary inductive element 130 can be used for basic plasma generation and reliable start during the inherently transient ignition stage. The primary inductive element 130 can be coupled to a powerful RF generator and expensive auto-tuning matching network and can be operated at an increased RF frequency, such as at about 13.56 MHz.

The secondary inductive element 140 can be used for corrective and supportive functions and for improving the stability of the plasma during steady state operation. Since the secondary inductive element 140 can be used primarily for corrective and supportive functions and improving stability of the plasma during steady state operation, the secondary inductive element 140 does not have to be coupled to as powerful an RF generator as the primary inductive element 130 and can be designed differently and cost effectively to overcome the difficulties associated with previous designs. As discussed in detail below, the secondary inductive element 140 can also be operated at a lower frequency, such as at about 2 MHz, allowing the secondary inductive element 140 to be very compact and to fit in a limited space on top of the dielectric window.

The primary inductive element 130 and the secondary inductive element 140 can be operated at different frequencies. The frequencies can be sufficiently different to reduce cross-talk in the plasma between the primary inductive element 130 and the secondary inductive element 140. For instance, the frequency applied to the primary inductive element 130 can be at least about 1.5 times greater than the frequency applied to the secondary inductive element 140. In some implementations, the frequency applied to the primary inductive element 130 can be about 13.56 MHz and the frequency applied to the secondary inductive element 140 can be in the range of about 1.75 MHz to about 2.15 MHz. Other suitable frequencies can also be used, such as about 400 kHz, about 4 MHz, and about 27 MHz. While the present disclosure is discussed with reference to the primary inductive element 130 being operated at a higher frequency relative to the secondary inductive element 140, those of ordinary skill in the art, using the disclosures provided herein, should understand that the secondary inductive element 140 could be operated at the higher frequency without deviating from the scope of the present disclosure.

The secondary inductive element 140 can include a planar coil 142 and a magnetic flux concentrator 144. The magnetic flux concentrator 144 can be made from a ferrite material. Use of a magnetic flux concentrator with a proper coil can give high plasma coupling and good energy transfer efficiency of the secondary inductive element 140, and can significantly reduce its coupling to the metal shield 150. Use of a lower frequency, such as about 2 MHz, on the secondary inductive element 140 can increase skin layer, which also improves plasma heating efficiency.

According to aspects of the present disclosure, the different inductive elements 130 and 140 can carry different functions. Specifically, the primary inductive element 130 can be used to carry out the basic functions of plasma generation during ignition and providing enough priming for the secondary inductive element 140. The primary inductive element 130 can have coupling to both plasma and the grounded shield to stabilize plasma potential. The first Faraday shield 154 associated with the primary inductive element 130 avoids window sputtering and can be used to supply the coupling to the ground.

Additional coils can be operated in the presence of good plasma priming provided by the primary inductive element 130 and as such, preferably have good plasma coupling and good energy transfer efficiency to plasma. A secondary inductive element 140 that includes a magnetic flux concentrator 144 provides both a good transfer of magnetic flux to plasma volume and at the same time a good decoupling of the secondary inductive element 140 from the surrounding metal shield 150. The use of magnetic flux concentrators 144 and symmetric driving of the secondary inductive element 140 further reduces the amplitude of the voltage between coil ends and surrounding grounded elements. This can reduce sputtering of the dome, but at the same time gives some small capacitive coupling to plasma, which can be used to assist ignition. In some implementations, a second Faraday shield can be used in combination with this secondary inductive element 140 to reduce capacitive coupling of the secondary inductive element 140.

Figure 2:
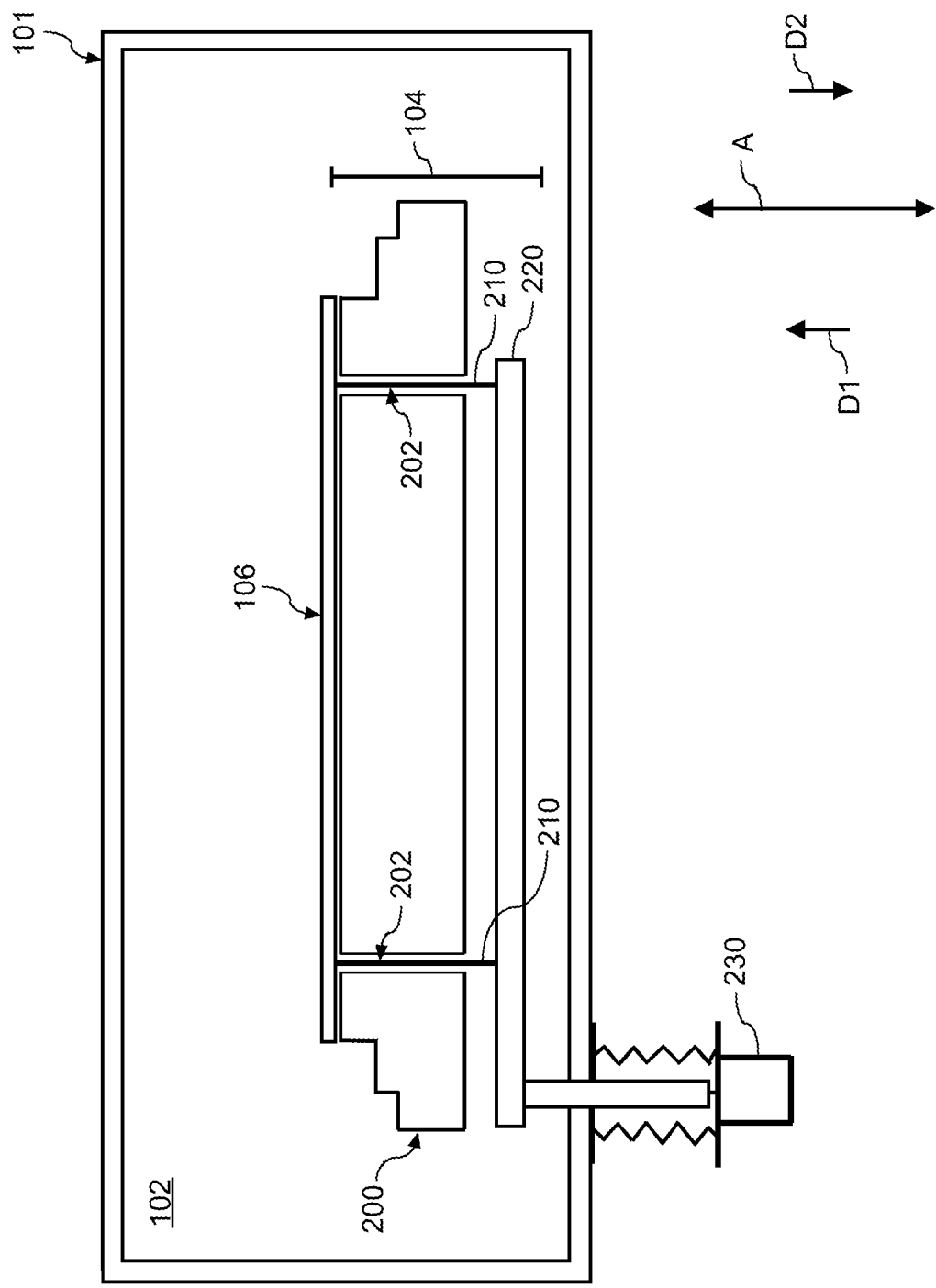
FIG. 2 depicts a pedestal assembly of a plasma processing apparatus according to an example embodiment of the present disclosure.
Figure 3:
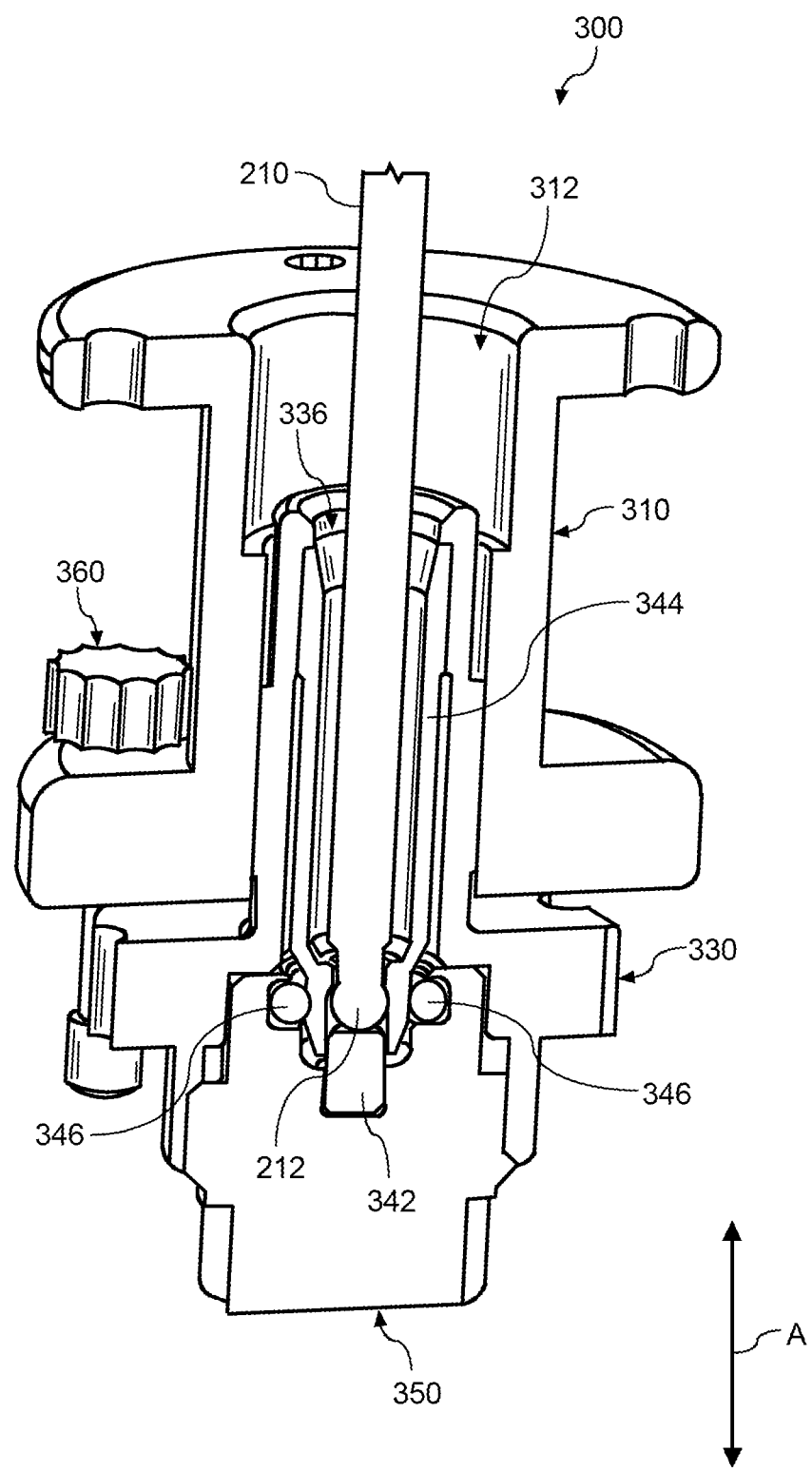
FIG. 3 depicts a cross-sectional view of a lift pin assembly according to an example embodiment of the present disclosure.
Figure 4:
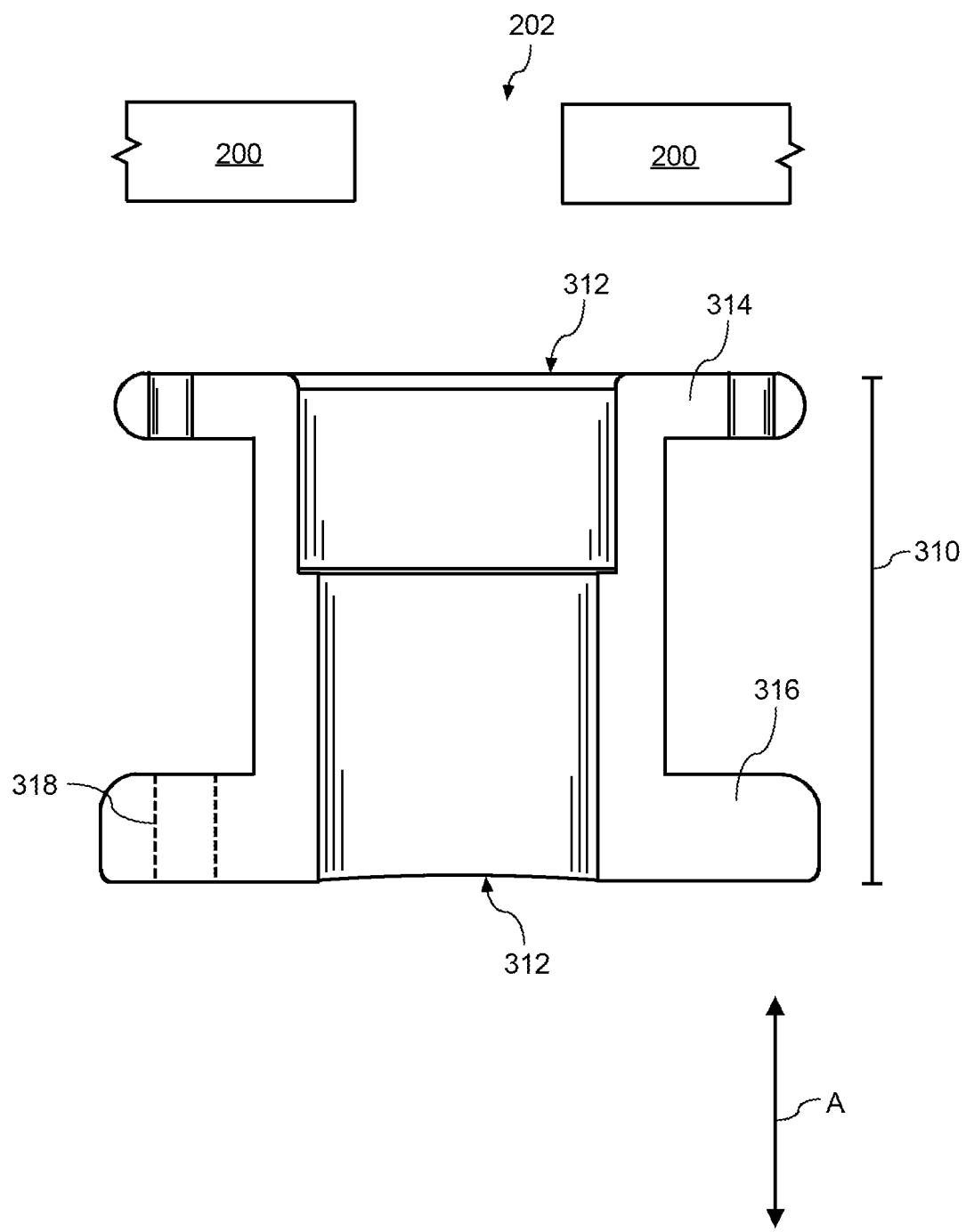
FIG. 4 depicts alignment of a pin housing of the lift pin assembly of FIG. 3 relative to an electrostatic chuck of a plasma processing apparatus according to example embodiments of the present disclosure.
Figure 5:
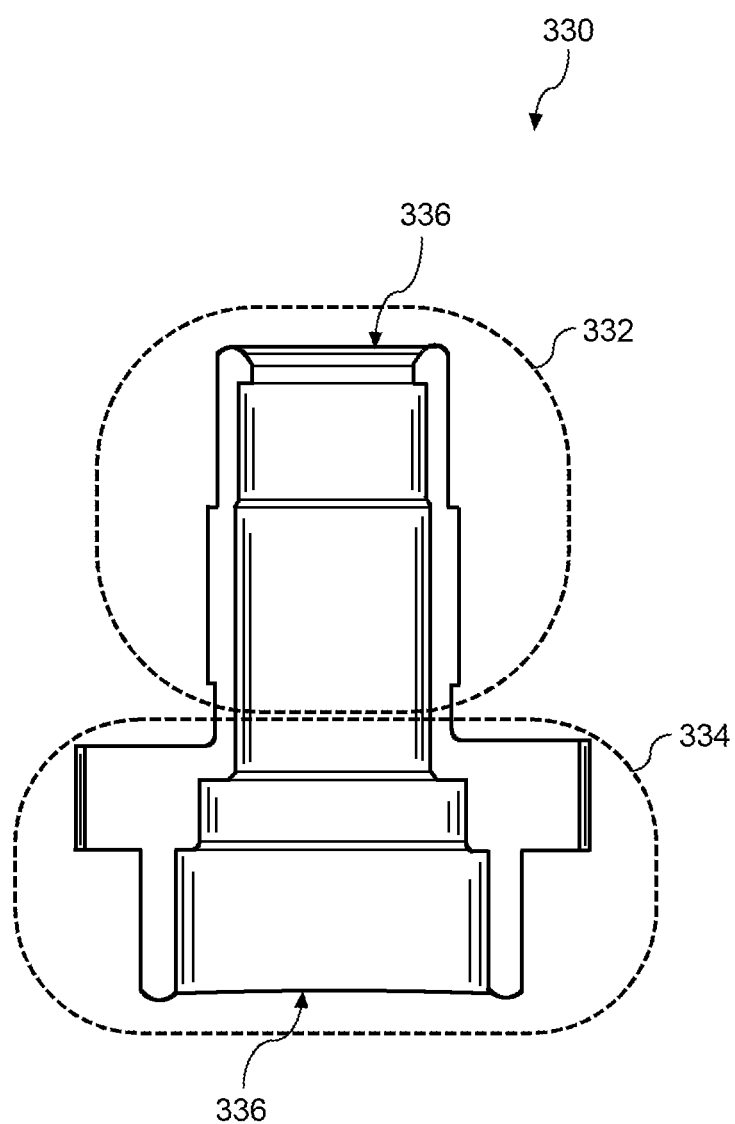
FIG. 5 depicts a cross-sectional view of a pin height adjustment member of the lift pin assembly of FIG. 3.
Figure 6:
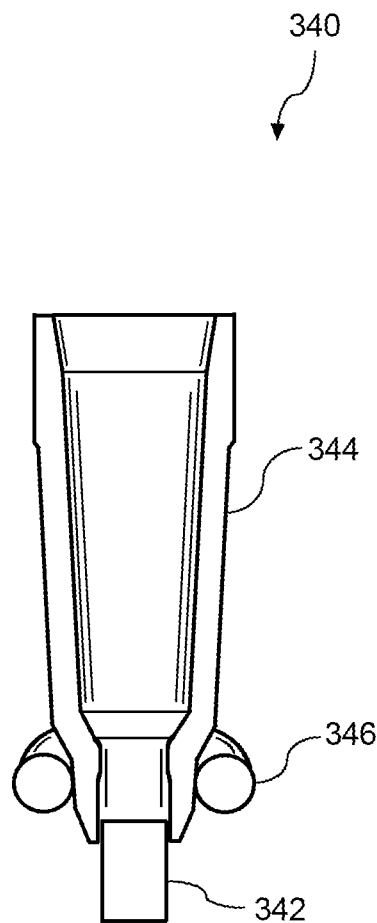
FIG. 6 depicts a cross-sectional view of a pin holder assembly of the lift pin assembly of FIG. 3.
Figure 7:
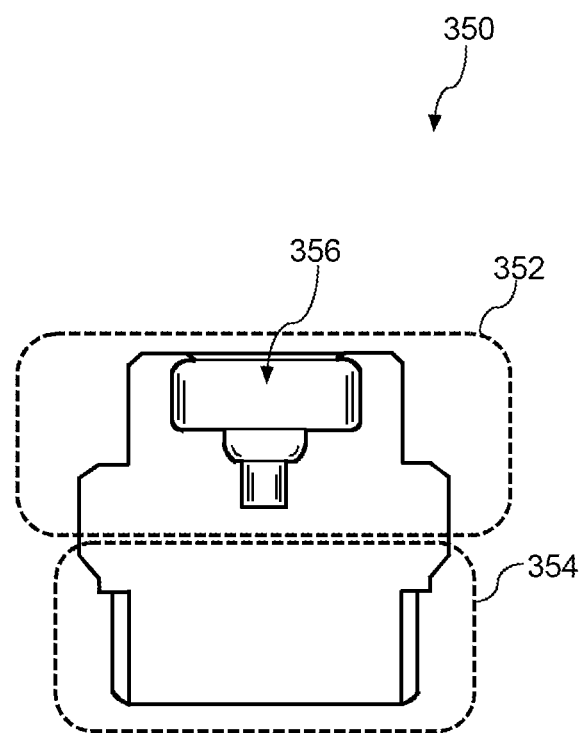
FIG. 7 depicts a cross-sectional view of a locker of the lift pin assembly of FIG. 3.
Figure 8:
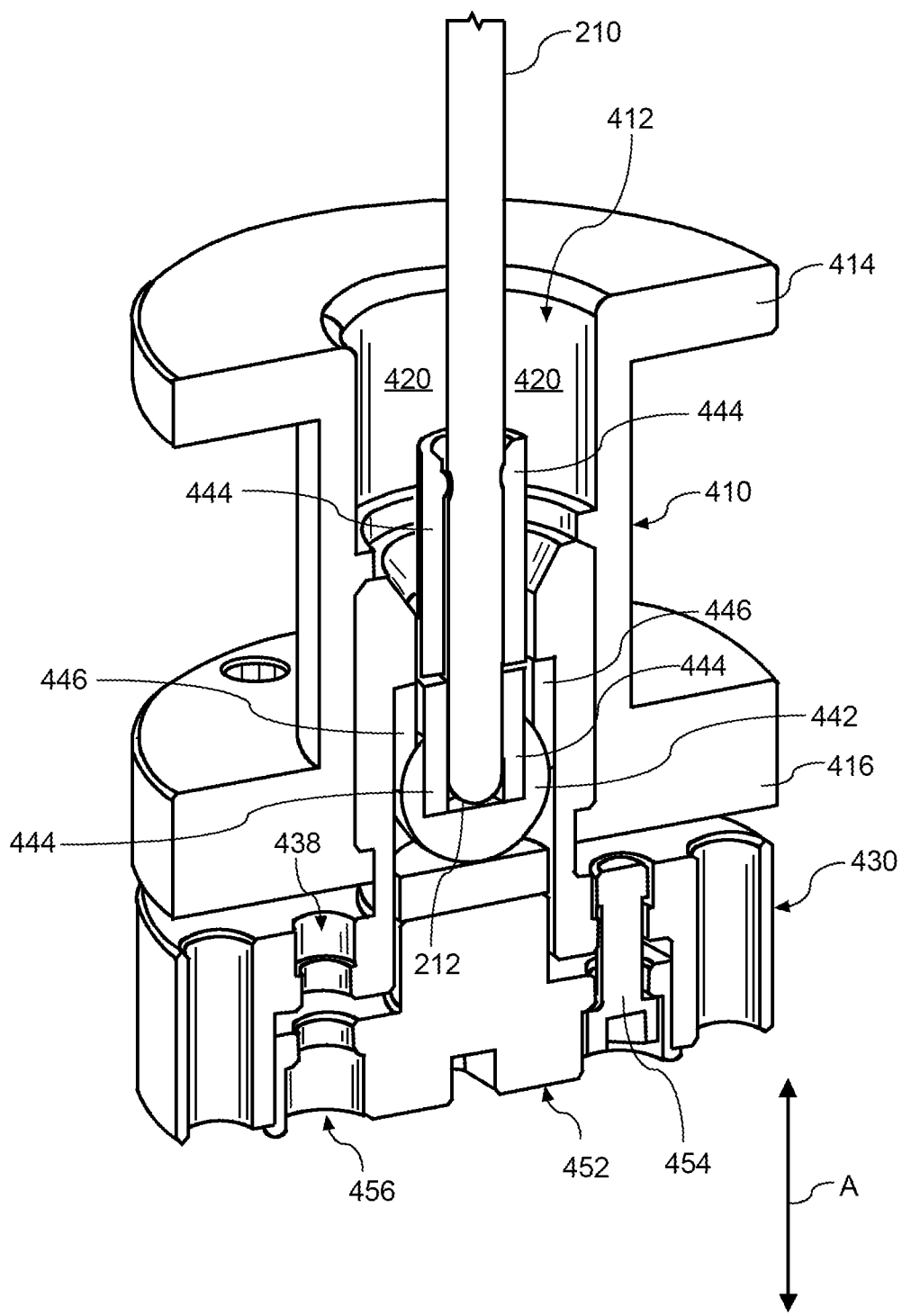
FIG. 8 depicts a cross-sectional view of a lift pin assembly according to another example embodiment of the present disclosure.
Figure 9:
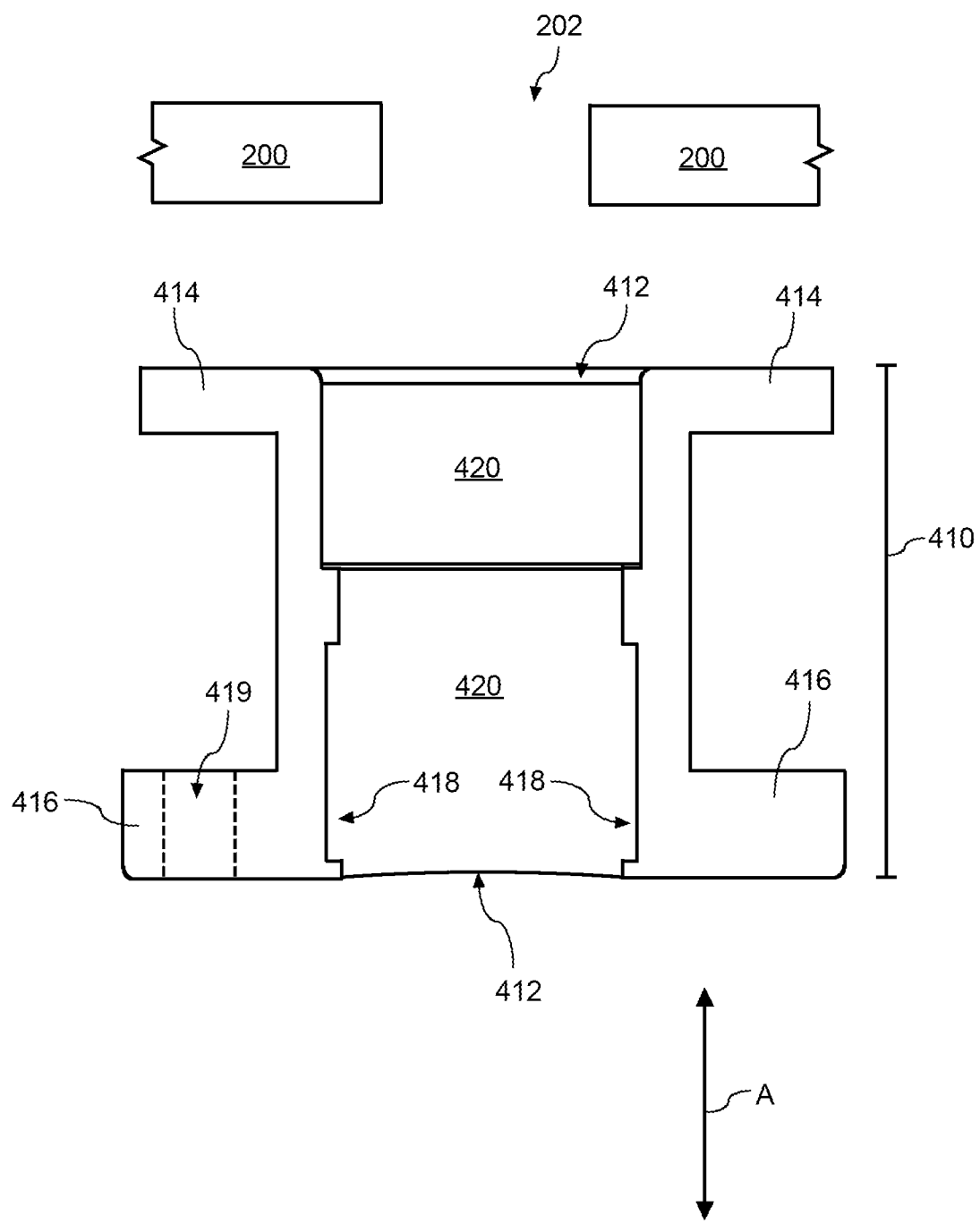
FIG. 9 depicts alignment of a pin housing of the lift pin assembly of FIG. 8 relative to an electrostatic chuck of a plasma processing apparatus according to example embodiments of the present disclosure.
Figure 10:
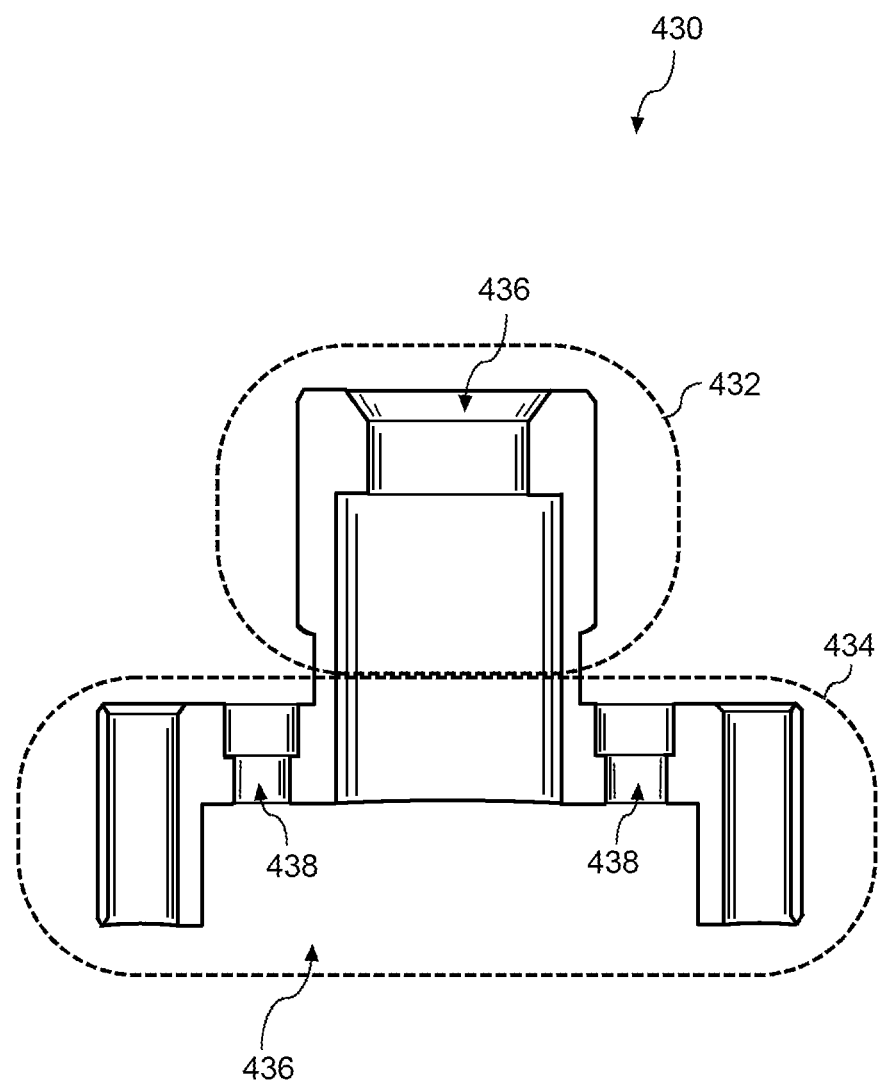
FIG. 10 depicts a cross-sectional view of a pin height adjustment member of the lift pin assembly of FIG. 8.
Figure 11:
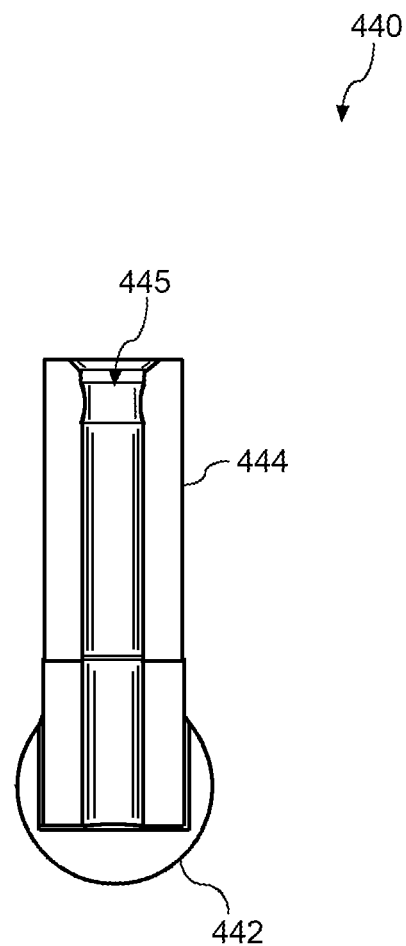
FIG. 11 depicts a cross-sectional view of a pin holder assembly of the lift pin assembly of FIG. 8.
Figure 12:
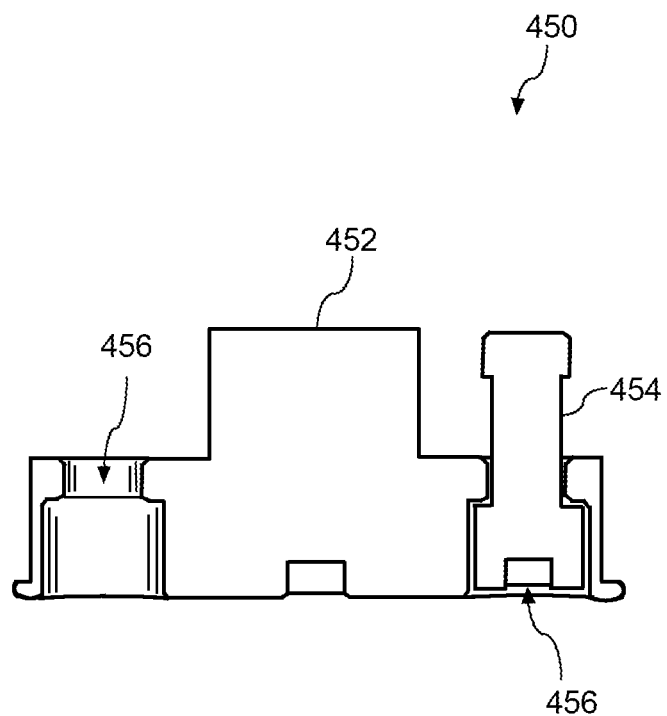
FIG. 12 depicts a cross-sectional view of a locker of a locker assembly of the lift pin assembly of FIG. 8.

Referring now to FIG. 2, the pedestal assembly 104 can include an electrostatic chuck 200 configured to support the workpiece 106. In some implementations, the electrostatic chuck 200 can include a puck and a baseplate configured to support the puck. For instance, the puck can be disposed on the baseplate. The puck can be configured to support the workpiece 106. In alternative implementations, the workpiece 106 can be disposed on the baseplate.

In some implementations, the pedestal assembly 104 can include a plurality of lift pins 210. For instance, the pedestal assembly 104 can include two lift pins 210. In alternative implementations, the pedestal assembly 104 can include more lift pins 210 or fewer lift pins 210. As shown, each of the plurality of lift pins 210 can extend into a corresponding opening of a plurality of openings 202 defined by the electrostatic chuck 200. For instance, in some implementations, the plurality of openings 202 can be defined by the baseplate of the electrostatic chuck 200.

In some implementations, the pedestal assembly 104 can include a support plate 220 for the plurality of lift pins 210. In such implementations, the pedestal assembly 104 can further include a motor (e.g., electric motor) configured to move the support plate 220 along an axis A in a first direction D1 or a second direction D2 that is opposite the first direction D1. For instance, the electric motor 230 can be operated to move the support plate 220 along the axis A in the first direction D1 to move the support plate 220 towards a ceiling (e.g., dielectric window 110) of the processing chamber 101. Conversely, the electric motor 230 can be operated to move the support plate 220 along the axis A in the second direction D2 to move the support plate 220 towards a floor of the processing chamber 101.

When the support plate 220 moves along the axis A in the first direction D1 (e.g., towards the ceiling of the processing chamber 101), each of the lift pins 210 supported by the support plate 220 move along the axis A in the first direction D1. More particularly, the electric motor 230 can be operated to move the support plate 220 along the axis A in the first direction D1 until each of the lift pins 210 extends through a corresponding opening of the plurality of openings 202 defined by the electrostatic chuck 200. In this manner, the workpiece 106 can be lifted off of the electrostatic chuck 200 via the lift pins 210.

Conversely, each of the lift pins 210 supported by the support plate 220 can move in the second direction D2 when the support plate 220 moves along the axis A in the second direction D2 (e.g., towards a floor of the processing chamber 101). More particularly, the electric motor 230 can be operated to move the support plate 220 along the axis A in the second direction D2 until the plurality of lift pins 210 no longer extend through the corresponding opening of the plurality of openings 202 defined by the electrostatic chuck 200. In this manner, the workpiece 106 can be lowered onto the electrostatic chuck 200 via the lift pins 210.

It should be understood that the lift pins 210 can contact (e.g., rub) the electrostatic chuck 200 when the lift pins 210 are misaligned (e.g., not parallel) with the corresponding opening of the plurality of openings 202 defined by the electrostatic chuck 200. Friction due to the lift pins 210 contacting (e.g., rubbing) the electrostatic chuck 200 can cause the lift pins 210 to shear. Alternatively, or additionally, particles that are generated due to the friction can accumulate on the lift pins 210. As will be discussed below, example aspects of the present disclosure are directed to lift pin assemblies that prevent the lift pins 210 from becoming misaligned with the openings 202 defined by the electrostatic chuck 200 and thereby prevent the lift pins 210 from contacting the electrostatic chuck 200.

Referring now to FIGS. 3 through 7, a lift pin assembly 300 for one of the lift pins 210 is provided according to an example embodiment of the present disclosure. The lift pin assembly 300 can include a pin housing 310. The pin housing 310 can define an opening 312. As shown, the lift pin 210 can extend into the opening 312 defined by the pin housing 310. Furthermore, the pin housing 310 can be positioned relative to the electrostatic chuck 200 such that the opening 312 defined by the pin housing 310 is aligned with the opening 202 defined by the electrostatic chuck 200. In some implementations, opposing ends 314, 316 of the pin housing 310 can each include a flange. It should be appreciated that the pin housing 310 can have any suitable shape. For instance, in some implementations, the pin housing 310 can have a cylindrical shape.

The lift pin assembly 300 can include a pin height adjustment member 330. The pin height adjustment member 330 can be movable along the axis A to adjust an amount of the lift pin 210 that is positioned within the opening 202 defined by the electrostatic chuck 200. In some implementations, the pin height adjustment member 330 can move relative to the pin housing 310. For instance, the pin height adjustment member 330 can move along the axis A independent of the pin housing 310.

The pin height adjustment member 330 can move along the axis A in the first direction D1 to move the lift pin 210 into the opening 202 defined by the electrostatic chuck 200. For instance, the pin height adjustment member 330 can move the lift pin 210 along the axis A in the first direction D1 to lift the workpiece 106 (FIG. 2) off of the electrostatic chuck 200. Conversely, the pin height adjustment member 330 can move along the axis A in the second direction D2 to move the lift pin 210 out of the opening 202 defined by the electrostatic chuck 200. For instance, the pin height adjustment member 330 can move the lift pin 210 along the axis A in the second direction D2 to lower the workpiece 106 onto the electrostatic chuck 200.

As shown, the pin height adjustment member 330 can be partially positioned within the opening 312 defined by the pin housing 310. For instance, the pin height adjustment member 330 can include a first portion 332 positioned within the opening 312 defined by the pin housing 310 and a second portion 334 positioned outside of the opening 312 defined by the pin housing 310. In some implementations, the first portion 332 of the pin height adjustment member 330 can have a first shape, whereas the second portion 334 of the pin height adjustment member 330 can have a second shape that is different than the first shape.

The lift pin assembly 300 can include a pin holder assembly 340. The pin holder assembly 340 can be configured to hold the lift pin 210 such that the lift pin 210 is aligned (e.g., parallel) with the opening 202 (FIG. 2) defined by the electrostatic chuck 200. In this manner, the lift pin assembly 300 can prevent contact between the lift pin 210 and the electrostatic chuck 200 due, at least in part, to the lift pin 210 being misaligned (e.g., not parallel) with the opening 202 defined by the electrostatic chuck 200.

As shown, the pin holder assembly 340 can be at least partially positioned within an opening 336 defined by the pin height adjustment member 330. In some implementations, the pin holder assembly 340 can include a base 342 configured to support the lift pin 210. For instance, an end 212 of the lift pin 210 can be positioned on the base 342. In some implementations, the end 212 of the lift pin 210 can be a ball end. It should be appreciated, however, that the end of the lift pin 210 can have any suitable shape.

The pin holder assembly 340 can further include a clamp 344. The clamp 344 can be configured to apply a clamping force on the lift pin 210. For instance, the clamp 344 can apply the clamping force to prohibit movement (e.g., translation) of the lift pin 210 along the axis A independent of the pin height adjustment member 330. In some implementations, the lift pin 210 can still rotate about the axis A while the clamp 344 is applying the clamping force on the lift pin 210.

In some implementations, the pin holder assembly 340 can include a gasket 346. As shown, the gasket 346 can be positioned such that the gasket 346 surrounds a periphery of the clamp 344. More particularly, the gasket 346 can compress the clamp 344 to cause the clamp 344 to apply the clamping force on the lift pin 210. In some implementations, the gasket 346 can include an O-ring. It should be appreciated that the gasket 346 can include any suitable material. For instance, in some implementations, the gasket 346 can include an elastic material.

In some implementations, the lift pin assembly 300 can include a locker 350. The locker 350 can be partially positioned within the opening 336 defined by the pin height adjustment member 330. For instance, a first portion 352 of the locker 350 can be positioned within the opening 336 defined by the pin height adjustment member 330, whereas a second portion 354 of the locker 350 can be positioned outside of the opening 336 defined by the pin height adjustment member 330.

As shown, the first portion 352 of the locker 350 can define a recess 356 in which a portion of the pin holder assembly 340 is positioned. For instance, the base 342 of the pin holder assembly 340 can be positioned within the recess 356. Furthermore, in some implementations, the gasket 346 and a portion of the clamp 344 can be positioned within the recess 356. In this manner, movement (e.g., translation) of the pin holder assembly 340 along the axis A can be limited via the locker 350.

In some implementations, the lift pin assembly 300 can include a fastener 360 configured to lockout the pin height adjustment member 330 once the lift pin 210 reaches a desired height. For instance, the desired height can correspond to a first height needed for the lift pin 210 to lift the workpiece 106 (FIG. 2) off of the electrostatic chuck 200. Conversely, the desired height can correspond to a second height needed for the lift pin 210 to set the workpiece 106 on the electrostatic chuck 200. In this manner, the lift pin 210 can be locked out at the desired height (e.g., first height or second height) via the fastener 360 of the lift pin assembly 300.

In some implementations, the fastener 360 can extend through an opening 318 defined by end 316 of the pin housing 310. Furthermore, the fastener 360 can extend through an opening (not shown) defined by the pin height adjustment member 330. In this manner, movement (e.g., translation) of the pin height adjustment member 330 can be prevented when the fastener 360 extends through the opening 318 defined by the pin housing 310 and the opening defined by the pin height adjustment member 330.

In some implementations, the opening 318 defined by the pin housing 310 and the opening defined by the pin height adjustment member 330 can each be threaded. In such implementations, the fastener 360 can include a threaded fastener (e.g., lock screw). In this manner, the threaded fastener can mesh with the threaded opening defined by the pin housing 310 and the pin height adjustment member 330 to lock out the pin height adjustment member 330. More particularly, the threaded fastener can mesh with the threaded opening to prevent movement of the pin height adjustment member 330 along the axis A.

Referring now to FIGS. 8 through 12, a lift pin assembly 400 for one of the lift pins 210 is provided according to another example embodiment of the present disclosure. The lift pin assembly 400 can include a pin housing 410. The pin housing 410 can define an opening 412. As shown, the lift pin 210 can extend into the opening 412. In some implementations, opposing ends 414, 416 of the pin housing 410 can each include a flange. It should be appreciated that the pin housing 410 can have any suitable shape. For instance, in some implementations, the pin housing 410 can have a cylindrical shape.

The lift pin assembly 400 can include a pin height adjustment member 430. The pin height adjustment member 430 can be movable along the axis A to adjust an amount of the lift pin 210 that is positioned within the opening 202 defined by the electrostatic chuck 200. In some implementations, the pin height adjustment member 430 can move relative to the pin housing 410. For instance, the pin height adjustment member 430 can move along the axis A independent of the pin housing 410.

The pin height adjustment member 430 can move along the axis A in the first direction D1 to move the lift pin 210 into the opening 202 defined by the electrostatic chuck 200. For instance, the pin height adjustment member 430 can move the lift pin 210 along the axis A in the first direction D1 to lift the workpiece 106 (FIG. 2) off of the electrostatic chuck 200. Conversely, the pin height adjustment member 430 can move along the axis A in the second direction D2 to move the lift pin 210 out of the opening defined by the electrostatic chuck 200. For instance, the pin height adjustment member 430 can move the lift pin 210 along the axis A in the second direction D2 to lower the workpiece 106 onto the electrostatic chuck 200.

As shown, the pin height adjustment member 430 can be partially positioned within the opening 412 defined by the pin housing 410. For instance, the pin height adjustment member 430 can include a first portion 432 positioned within the opening 412 defined by the pin housing 410 and a second portion 434 positioned outside of the opening 412 defined by the pin housing 410. In some implementations, the first portion 432 of the pin height adjustment member 430 can have a first shape, whereas the second portion 434 of the pin height adjustment member 430 can have a second shape that is different than the first shape. Furthermore, in some implementations, the first shape of the first portion 432 of the pin height adjustment member 430 can correspond to the shape of a notch 418 defined by an interior surface 420 of the pin housing 410. In this manner, the first portion 432 of the pin height adjustment member 430 can be positioned within the notch 418 defined by the interior surface 420 of the pin housing 410.

The lift pin assembly 400 can include a pin holder assembly 440. The pin holder assembly 440 can be configured to hold the lift pin 210 such that the lift pin 210 is aligned (e.g., parallel) with the opening 202 (FIG. 2) defined by the electrostatic chuck 200. In this manner, the lift pin assembly 400 can prevent contact between the lift pin 210 and the electrostatic chuck 200 due, at least in part, to the lift pin 210 being misaligned (e.g., not parallel) with the opening 202 defined by the electrostatic chuck 200.

As shown, the pin holder assembly 440 can be at least partially positioned within an opening 436 defined by the pin height adjustment member 430. In some implementations, the pin holder assembly 440 can include a base 442 configured to support the lift pin 210. For instance, an end 212 of the lift pin 210 can be positioned on the base 442. In some implementations, the base 442 can define a notch or cavity. Furthermore, in such implementations, the end 212 of the lift pin 210 can be positioned within the cavity defined by the base 442.

In some implementations, the pin holder assembly 440 can include an inner sleeve 444. The inner sleeve 444 can be supported, at least in part, by the base 442. For instance, in some implementations, an end of the inner sleeve 444 can be positioned within the cavity defined by the base 442. As shown, the inner sleeve 444 can define an opening 445. In this manner, the lift pin 210 can be inserted into the opening 445 such that the inner sleeve 444 surrounds a periphery of a portion of the lift pin 210. In some implementations, the pin holder assembly 440 can include an outer sleeve 446. For instance, the outer sleeve 446 can be positioned relative to the inner sleeve 444 such that the outer sleeve 446 surrounds a portion (e.g., bottom portion) of the inner sleeve 444.

In some implementations, the base 442 can have a shape corresponding to a sphere. Furthermore, in such implementations, the end 212 of the lift pin 210 can be positioned within the cavity defined by the base 442. In this manner, the base 442, due to its spherical shape, can act as a sphere joint that allows the lift pin 210 to tilt in one or more directions about an axis (e.g., axis A) to facilitate alignment of the lift pin 210 with the corresponding opening 202 in the electrostatic chuck 200 and thereby reduce or eliminate friction between the lift pin 210 and the opening 202.

It should be appreciated that any two components of the pin holder assembly 440 can be combined with one another to reduce the number of components of the pin holder assembly 440. For instance, in some implementations, the inner sleeve 444 can be integral with the base 442. In this manner, the base 442 and the inner sleeve 444 can be a unitary component that facilitates alignment of the lift pin 210 with the opening 202 in the electrostatic chuck 200.

In some implementations, the lift pin assembly 400 can include a locker assembly 450. The locker assembly 450 can include a locker 452 and one or more fasteners 454 (only one shown). The locker 452 can define a plurality of recesses 456. As shown, each of the recesses 456 can have a shape corresponding to a shape of a first portion (e.g., lower portion) of the one or more fasteners 454. In this manner, the first portion of the one or more fasteners 454 can be positioned within a corresponding recess of the recesses 456 defined by the locker 452. Additionally, a second portion (e.g. upper portion) of the one or more fasteners 454 can have a shape corresponding to a shape of recesses 438 defined by the pin height adjustment member 430. In this manner, the second portion of the one or more fasteners 454 can be positioned within a corresponding recess of the plurality of recesses 438 defined by the pin height adjustment member 430 to removably couple the locker 452 to the pin height adjustment member 430. For instance, in some implementations, the locker 452 can be removably coupled to the pin height adjustment member 430 via the one or more fasteners 454 such that the locker 452 restricts movement of the pin holder assembly 440 along the axis A.

In some implementations, the lift pin assembly 400 can include a fastener configured to lock out the pin height adjustment member 430 once the lift pin 210 reaches a desired height. For instance, the desired height can correspond to a first height needed for the lift pin 210 to lift the workpiece 106 (FIG. 2) off of the electrostatic chuck 200. Conversely, the desired height can correspond to a second height needed for the lift pin 210 to set the workpiece 106 on the electrostatic chuck 200. In this manner, the lift pin 210 can be locked in at the desired height (e.g., first height or second height) via the fastener of the lift pin assembly 400.

In some implementations, the fastener can extend through an opening 419 defined by end 416 of the pin housing 410. Furthermore, the fastener can extend through an opening (not shown) defined by the pin height adjustment member 430. In this manner, movement (e.g., translation) of the pin height adjustment member 430 can be prevented when the fastener 460 extends through the opening 419 defined by the pin housing 410 and the opening defined by the pin height adjustment member 430.

In some implementations, the opening 419 defined by the pin housing 410 and the opening defined by the pin height adjustment member 430 can each be threaded. In such implementations, the fastener can include a threaded fastener (e.g., lock screw). In this manner, the threaded fastener can mesh with the threaded opening defined by the pin housing 410 and the pin height adjustment member 430 to lockout the pin height adjustment member 430. More particularly, the threaded fastener can mesh with the threaded opening to prevent movement (e.g., translation) of the pin height adjustment member 430 along the axis A.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged in whole or in part. Furthermore, those of ordinary skill in the art will appreciate that the foregoing description is by way of example only and is not intended to limit the invention so further described in such appended claims.

What is claimed is:

1. A lift pin assembly for a lift pin of a plasma processing apparatus, the lift pin assembly comprising:
   a pin housing defining an opening into which the lift pin extends, the pin housing positioned such that the opening is aligned with an opening defined by an electrostatic chuck of the plasma processing apparatus;
   a pin height adjustment member partially positioned within the opening defined by the pin housing, the pin height adjustment member movable along an axis in a first direction and a second direction, the pin height adjustment member movable in the first direction to move the lift pin into the opening defined by the electrostatic chuck, the pin height adjustment member movable in the second direction to move the lift pin out of the opening defined by the electrostatic chuck;
   a pin holder assembly at least partially positioned within an opening defined by the pin height adjustment member, the pin holder assembly configured to hold the lift pin such that the lift pin is aligned with the opening defined by the electrostatic chuck; and
   a fastener configured to prohibit movement of the pin height adjustment member along the axis.

2. The lift pin assembly of claim 1, wherein the pin height adjustment member comprises:
   a first portion positioned within the opening defined by the pin housing, the first portion having a first shape; and a second portion positioned outside of the opening defined by the pin housing, the second portion having a second shape, the second shape being different than the first shape.

3. The lift pin assembly of claim 2, wherein the first portion of the pin height adjustment member is positioned within a notch defined by an interior surface of the pin housing.

4. The lift pin assembly of claim 1 wherein the fastener extends through an opening defined by an end of the pin housing.

5. The lift pin assembly of claim 4, wherein the fastener comprises a lock screw.

6. The lift pin assembly of claim 1, wherein the pin holder assembly comprises:
an inner sleeve surrounding a periphery of the lift pin;
an outer sleeve surrounding a portion of the inner sleeve; and
a base configured to support the inner sleeve.

7. The lift pin assembly of claim 6, wherein:
the base has a shape corresponding to a sphere, the base defining a cavity; and
when an end of the lift pin is positioned within the cavity, the lift pin is tiltable about the axis to facilitate alignment of the lift pin with the opening defined by the electrostatic chuck.

8. The lift pin assembly of claim 6, further comprising:
a locker assembly comprising a locker and the fastener, the locker removably coupled to the pin height adjustment member via the fastener.

9. The lift pin assembly of claim 8, wherein when the locker is coupled to the pin height adjustment member via the fastener, the locker restricts movement of the pin holder assembly along the axis.

10. The lift pin assembly of claim 1, wherein the pin height adjustment member is movable relative to the pin housing along the axis.

11. The lift pin assembly of claim 10, wherein the pin holder assembly comprises:
a base configured to support the lift pin; and
a clamp configured to apply a clamping force to tee the lift pin.

12. The lift pin assembly of claim 11, further comprising:
a locker partially positioned within the opening defined by the pin height adjustment member such that the locker restrict movement of the pin holder assembly along the axis.

13. The lift pin assembly of claim 12, wherein the pin holder assembly further comprises:
a gasket surrounding a periphery of the clamp such that the clamp applies the clamping force to the lift pin.

14. The lift pin assembly of claim 13, wherein the gasket and the base are positioned within a recess defined by the locker.

15. A plasma processing apparatus comprising:
a processing chamber;
an electrostatic chuck positioned within the processing chamber, the electrostatic chuck configured to support a workpiece; and
a lift pin assembly comprising:
a pin housing defining an opening into which a lift pin extends, the pin housing positioned such that the opening defined by the pin housing is aligned with an opening defined by the electrostatic chuck;
a pin height adjustment member partially positioned within the opening defined by the pin housing, the pin height adjustment member movable along an axis in a first direction and a second direction, the pin height adjustment member movable in the first direction to move the lift pin into the opening defined by the electrostatic chuck to lift the workpiece off of the electrostatic chuck, the pin height adjustment member movable in the second direction to move the lift pin out of the opening defined by the electrostatic chuck to lower the workpiece onto the electrostatic chuck; and
a pin holder assembly at least partially positioned within an opening defined by the pin height adjustment member, the pin holder assembly configured to hold the lift pin such that the lift pin is aligned with the opening defined by the electrostatic chuck, the pin holder assembly being configured to hold the lift pin such that the lift pin is rotatable about the axis.

16. The plasma processing apparatus of claim 15, wherein the pin holder assembly is configured to hold the lift pin to prohibit movement of the lift pin relative to the pin height adjustment member along the axis.

17. The plasma processing apparatus of claim 15, wherein the pin holder assembly comprises a clamp configured to clamp an end of the lift pin.

18. The plasma processing apparatus of claim 17, wherein the end of the lift pin comprises a ball end.

19. The plasma processing apparatus of claim 15, wherein the pin height adjustment member comprises:
a first portion positioned within the opening defined by the pin housing, the first portion having a first shape; and
a second portion positioned outside of the opening defined by the pin housing, the second portion having a second shape, the second shape being different than the first shape.

* * * * *